(12) United States Patent
Kumakura

(10) Patent No.: US 6,316,104 B1
(45) Date of Patent: Nov. 13, 2001

(54) ADHESIVES AND CIRCUIT MATERIALS USING SAID ADHESIVES

(75) Inventor: Masayuki Kumakura, Tochigi (JP)

(73) Assignee: Sony Chemicals Corporation, Tokyo (JP)

(*) Notice: Subject to any disclaimer, the term of this patent is extended or adjusted under 35 U.S.C. 154(b) by 0 days.

(21) Appl. No.: 09/446,455

(22) PCT Filed: May 14, 1999

(86) PCT No.: PCT/JP99/02506
§ 371 Date: Dec. 29, 1999
§ 102(e) Date: Dec. 29, 1999

(87) PCT Pub. No.: WO99/60070
PCT Pub. Date: Nov. 25, 1999

(30) Foreign Application Priority Data

May 19, 1998 (JP) .................................................. 10-136188

(51) Int. Cl.$^7$ ........................................................ D02G 3/00
(52) U.S. Cl. ........................ 428/375; 428/378; 428/389; 174/96; 174/98; 174/118
(58) Field of Search .................................. 428/375, 378, 428/379, 389; 174/96, 98, 118

(56) References Cited

U.S. PATENT DOCUMENTS

| | | | |
|---|---|---|---|
| 3,692,924 | * | 9/1972 | Nye .................................. 174/121 A |
| 4,075,420 | * | 2/1978 | Walton .................................. 428/460 |
| 4,177,181 | * | 12/1979 | Tsurumi et al. .................... 524/823 |
| 4,185,046 | * | 1/1980 | Pengilly et al. .................... 428/458 |
| 4,381,420 | * | 4/1983 | Elliot et al. ............................ 174/32 |
| 5,253,318 | * | 10/1993 | Sayegh et al. ....................... 385/114 |
| 5,962,129 | * | 10/1999 | Halloran et al. .................... 428/348 |

FOREIGN PATENT DOCUMENTS 63-20354  1/1988  (JP) .

* cited by examiner

Primary Examiner—Cathy Lam
(74) Attorney, Agent, or Firm—Oliff & Berridge, PLC

(57) ABSTRACT

Adhesives and adhesive films based on polymer resins and containing a cationic scavenger are provided for circuit materials and flat cables with metallic wiring. The cationic scavenger reduces free cations in the adhesive and prevents the loss over time of insulation and adhesive strength provided to the circuit materials.

16 Claims, 1 Drawing Sheet

ADHESIVES AND CIRCUIT MATERIALS USING SAID ADHESIVES

FIELD OF THE INVENTION

The present invention relates to the technical field of flat cables, particularly to flat cables using an adhesive based on a polyester resin.

PRIOR ART

In order to connect electronic devices using a number of wirings, a flat cable as shown by 110 in FIG. 2 has often been used.

This flat cable 110 comprises a copper wiring 105 formed of copper wires, for example, inserted between two adhesive films $102_1$, $102_2$. The adhesive films $102_1$, $102_2$ consist of resin films $103_1$, $103_2$ and adhesive layers $104_1$, $104_2$ on their surfaces, so that the copper wiring 105 is adhered to the resin films $103_1$, $103_2$ via the adhesive layers $104_1$, $104_2$. In such a flat cable 110, the copper wirings 105 are insulated from each other at high resistance with the adhesive layers $104_1$, $104_2$ filled between the copper wirings 105.

However, the flat cable 110 has the problem that insulation between the copper wirings 105 is lowered with time resulting in failure.

Another problem is that adhesive strength between the adhesive films $102_1$, $102_2$ or between the adhesive films $102_1$, $102_2$ and the copper wiring 105 is lowered with time resulting in lowered mechanical strength.

Such loss in insulation and adhesive strength has been attributed to corrosion of the copper wiring. Thus, the prior art took a measure to protect the copper wiring against corrosion by plating it, for example.

However, plating incurs high costs but has a little effect to prevent insulation loss. Thus, more suitable measures have been demanded.

An object of the present invention is to provide a flat cable with reduced loss of adhesive strength and insulation in order to solve the above disadvantages of the prior art.

Disclosure of the Invention

We initially attributed insulation loss to corrosion of the copper wiring by halogen ions liberated from a flame retardant added with a flame retardant aid such as aluminium hydroxide in the adhesive layers $104_1$, $104_2$ of such a flat cable 110.

Considering that flat cables prepared with an adhesive based on a polyester resin show significant loss in adhesive strength and insulation in an environment of high temperature or high temperature and high humidity, we prepared a flat cable with the adhesive containing an anion scavenger (an anion exchanger). However, its effect of prevention of insulation loss was less.

Then, we thought that loss in insulation and adhesive strength is not caused by halogen ions liberated from the flame retardant but copper ions dissoluting in the adhesive from the copper wiring to affect the resin film or adhesive components in the adhesive.

A possible measure against this is to prevent dissolution of copper ions from the copper wiring, but it is difficult. A more convenient and effective means presumably consists in including a cation scavenger in the adhesive to scavenge free copper ions in the adhesive.

Experiments revealed that loss in adhesive strength and insulation with time is reduced when a flat cable is prepared by laminating resin films with a polyester resin-based adhesive containing a cation scavenger.

The present invention is based on the above finding and relates to an adhesive based on a polyester resin characterized in that it contains a cation scavenger.

Said adhesive may contain a flame retardant and a flame-retardant aid to provide flame retardancy. The flame retardant may be a halogen compound such as decabromodiphenyl ether, for example. The flame-retardant aid may be a compound such as antimony trioxide or aluminium hydroxide. In addition to the flame retardant and flame-retardant aid, the adhesive may contain an antioxidant, coupling agent, colorant, thickener, anti-blocking agent, crosslinking agent, filler, etc.

If the flame retardant and flame-retardant aid are not added, the cation scavenger is preferably contained in an amount of 0.1 part by weight or more based on 100 parts by weight of the polyester resin.

If the flame retardant and flame-retardant aid are added, the total amount of the polyester resin, flame retardant and flame-retardant aid account for a great majority of the amount of the entire adhesive. In this case, the cation scavenger is also preferably contained in an amount of 0.1 part by weight or more based on 100 parts by weight of the total amount of the polyester resin, flame retardant and flame-retardant aid.

The above adhesive can be used to form an adhesive layer on a resin film to give an adhesive film. The adhesive layer can be formed by application of the adhesive.

The above adhesive can be used to laminate two resin films to each other to form a circuit material comprising a metallic wiring inserted between the two resin films.

Adhesive films having an adhesive layer formed from the above adhesive on a resin film can be laminated to each other to form a circuit material with a metallic wiring inserted between the two adhesive films.

THE MOST PREFERRED EMBODIMENTS OF THE INVENTION

Figure 1:
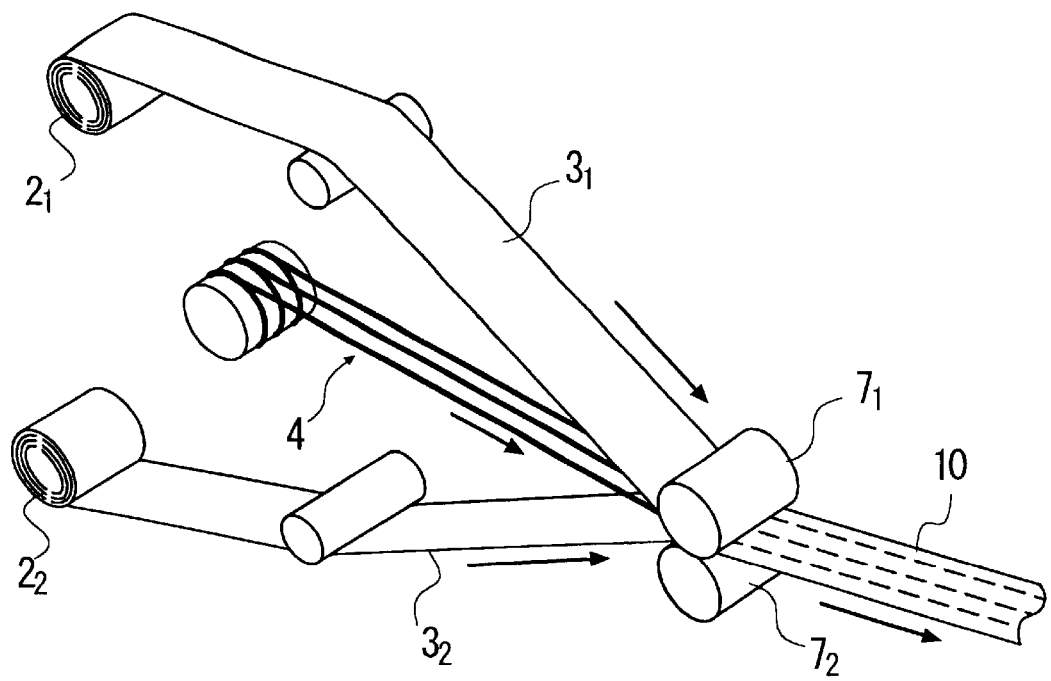
FIG. 1 illustrates a method for preparing a flat cable of the present invention.
Figure 2:
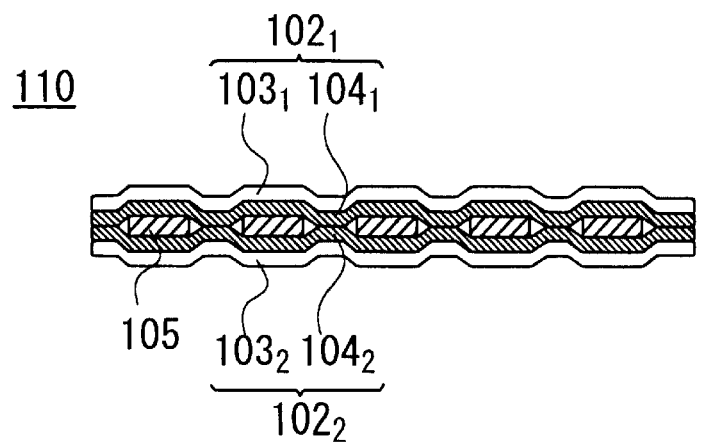
FIG. 2 illustrate the structure of a flat cable.

Preparation of Adhesives, Adhesive Films and Evaluation Samples

Using a cation scavenger based on titanium phosphate as a cation scavenger of the present invention, 1 part by weight of the cation scavenger was mixed with 100 parts by weight of a base consisting of 50 parts by weight of a saturated polyester resin and 50 parts by weight of additives (flame retardant, flame-retardant aid, antioxidant and filler) to prepare an adhesive of Example 1 of the present invention. The particle size of the cation scavenger is 0.7±0.2 μm and 1.0 g of the cation scavenger has an ability to scavenge 3.5 mmol of monovalent cation. The cation scavenger is dispersed in the adhesive without being dissolved.

Similarly, 0.1, 0.5 and 3.0 parts by weight of the same cation scavenger were mixed with 100 parts by weight of the base to prepare adhesives of Examples 2–4 of the present invention.

An amphoion scavenger was used in the same weight ratio in place of the cation scavenger in Example 1 (a mixture of a cation scavenger and an anion scavenger was used here) to prepare an adhesive of Example 5 of the present invention.

Then, each adhesive of Examples 1–5 was applied on the surface of a resin film consisting of a polyester film of 50 μm in thickness treated with a primer, and dried into an adhesive layer of 40–50 μm in thickness to prepare an adhesive film.

Determination of Adhesive Strength

The adhesive layers of two adhesive films were thoroughly heat-laminated to each other under the conditions of 170° C., 10 kgf/cm and 0.5 m/min, and T-peel adhesive strength was determined using a Tensilon tensile tester available from Toyo Baldwin at a tensile speed of 0.05 m/min.

An untreated copper foil was closely contacted with the surface of the adhesive layer of each adhesive film and heat laminated to the adhesive film under the same conditions, and T-peel adhesive strength was determined in the same manner as above.

As for copper foil laminates, T-peel adhesive strength was determined again after standing in an atmosphere of 136° C. for 168 hours.

Each adhesive film was heat laminated to a glass epoxy substrate carrying a comb-patterned copper wiring (JIS Z3197) under the same conditions as above, and insulation resistance was determined between copper wirings after applying a DC voltage of 500 V across the copper wirings for one minute.

After insulation resistance was determined, the assembly was allowed to stand in an atmosphere of 136° C. for 168 hours, and insulation resistance was determined again between copper wirings after applying a DC voltage of 500 V across the copper wirings for one minute.

As Comparative Example 1, the above base was used alone to form an adhesive layer on a resin film (polyester film), and two plies of the resulting adhesive film were laminated to each other. Alternatively, the adhesive film was laminated to a copper foil or a glass epoxy board carrying a copper wiring, and T-peel adhesive strength and insulation resistance were determined in the same manner as above.

As Comparative Examples 2–5, the above base was combined with any one of a hindered phenol additive, hydrazine additive, benzotriazole additive or anion scavenger in place of the cation scavenger to prepare an adhesive, which was used to form an adhesive layer on a resin film (polyester film), and the resulting adhesive film was determined for T-peel adhesive strength and insulation resistance.

The results are shown in the following Table 1, in which Comp. 1–5 represent Comparative Examples 1–5 and TC represents a tape connector.

TABLE 1

| | | | Comparative Example | | | | | Example | | | | |
|---|---|---|---|---|---|---|---|---|---|---|---|---|
| | | | Comp. 1 | Comp. 2 | Comp. 3 | Comp. 4 | Comp. 5 | Ex. 1 | Ex. 2 | Ex. 3 | Ex. 4 | Ex. 5 |
| Additive | | Type | (1) | (2) | (3) | (4) | (5) | | (6) | | | (7) |
| | | Loading | — | 1.0 | 1.0 | 1.0 | 1.0 | 1.0 | 0.1 | 0.5 | 3.0 | 1.0 |
| Adhesive Strength | TC/TC | No heat treatment | 4.0 | 4.0 | 3.0 | 3.0 | 4.0 | 4.0 | 4.0 | 4.0 | 4.0 | 4.0 |
| | TC/Cu | Before heat treatment | 0.5 | 0.5 | 0.5 | 0.5 | 0.5 | 0.5 | 0.5 | 0.5 | 0.4 | 0.5 |
| | | After heat treatment | 0.1 | 0.1 | 0.1 | 0.2 | 0.3 | 0.6 | 0.2 | 0.4 | 0.6 | 0.5 |
| Resistivity | | Before heat treatment | $1 \times 10^{14}$ | $1 \times 10^{14}$ | $1 \times 10^{14}$ | $1 \times 10^{14}$ | $1 \times 10^{14}$ | $1 \times 10^{14}$ | $1 \times 10^{14}$ | $1 \times 10^{14}$ | $1 \times 10^{14}$ | $1 \times 10^{14}$ |
| | | After heat treatment | $1 \times 10^{12}$ | $1 \times 10^{12}$ | $1 \times 10^{12}$ | $1 \times 10^{12}$ | $1 \times 10^{11}$ | $2 \times 10^{13}$ | $1 \times 10^{13}$ | $1 \times 10^{13}$ | $1 \times 10^{13}$ | $1 \times 10^{13}$ |
| Total evaluation | | | X | X | X | X | X | ◉ | Δ | ○ | ○ | ○ |

TC/TC: Assembly of adhesive films
TC/Cu: Assembly of an adhesive film and a copper foil
Unit of loading: parts by weight
Unit of adhesive strength: kg/cm
Unit of resistivity: Ω
Types of additives
(1): No additive
(2): Hindered phenol group
(3): Hydrazine group
(4): Benzotriazole group
(5): Anion exchanger
(6): Cation exchanger (cation scavenger)
(7): Amphoion exchanger (cation scavenger plus anion scavenger)

In this table, total evaluation ranks performance with symbols "◉, ○,Δ,x" in descending order. Comparative Examples (Comps. 1–5) are evaluated as "X" in total evaluation, indicating that they are not suitable for practical use due to low performances after heat treatment.

In these Comparative Examples (Comps. 1–5), all the copper foil laminates subjected to heat treatment were discolored and affected in their adhesive layers or polyester films by free copper ions.

In adhesives of the present invention and adhesive films or circuit materials using said adhesives, however, loss in insulation and adhesive strength was greatly reduced.

When a circuit material (flat cable) is to be practically prepared with one of said adhesive films, a patterned copper foil or copper wires may be used for copper wiring.

If a copper foil is used, it may be laminated to the adhesive film and then punched to form a copper wiring. If copper wires are used, the process may be as follows. An adhesive of the present invention is applied on a polyester film to form an adhesive film, which is then rolled up as shown by $2_1$, $2_2$ in FIG. 1, and adhesive films $3_1$, $3_2$ are unrolled from rolls $2_1$, $2_2$ and laminated to each other with copper wires 4 inserted between the adhesive layers under heat and pressure between rolls $7_1$, $7_2$ to form a circuit material (flat cable) 10.

This circuit material 10 and the circuit material using a copper foil also show a total evaluation similar to those of Examples 1–5 in Table 1.

Although a copper foil or copper wires were used in the foregoing, adhesives, adhesive films and circuit materials (flat cables) of the present invention are also effective when plated copper wires or other metallic wires are used.

Although titanium phosphate was used as a cation scavenger in the foregoing, the present invention is not limited thereto. As for the cation scavenger, tin phosphate, titanium hydroxide, and antimony pentoxide are included and may be used in this invention.

A cation scavenger and an anion scavenger may be dispersed in admixture. Accordingly, the present invention widely encompasses adhesives containing a cation scavenger capable of effectively scavenging cations liberated from metallic wiring.

Industrial Applicability

Loss in adhesive strength and insulation of adhesives is reduced. Thus, flat cables with high durability can be obtained.

What is claimed is:

1. An adhesive based on a polyester resin, characterized in that said adhesive contains a cation scavenger.

2. An adhesive according to claim 1 characterized in that said adhesive contains at least a flame retardant and a flame-retardant aid.

3. An adhesive according to claim 1 characterized in that said cation scavenger is contained in an amount of 0.1 part by weight or more based on 100 parts by weight of said polyester resin.

4. An adhesive according to claim 2 characterized in said cation scavenger is contained in an amount of 0.1 part by weight or more based on 100 parts by weight of the total amount of said polyester resin, said flame retardant, and said flame-retardant aid.

5. An adhesive film having a resin film and an adhesive layer formed on said resin film, characterized in that said adhesive layer is formed with an adhesive based on a polyester resin and containing a cation scavenger.

6. An adhesive film according to claim 5 characterized in that said adhesive contains at least a flame retardant and a flame-retardant aid.

7. An adhesive film according to claim 5 characterized in that said cation scavenger is contained in an amount of 0.1 part by weight or more based on 100 parts by weight of said polyester resin.

8. An adhesive film according to claim 6 characterized in said cation scavenger is contained in an amount of 0.1 part by weight or more based on 100 parts by weight of the total amount of said polyester resin, said flame retardant, and said flame-retardant aid.

9. A circuit material comprising a metallic wiring inserted between two resin films, characterized in that said two resin films are laminated to each other with an adhesive based on a polyester resin and containing a cation scavenger.

10. A circuit material according to claim 9 characterized in that said adhesive contains at least a flame retardant and a flame-retardant aid.

11. A circuit material according to claim 9 characterized in that said cation scavenger is contained in an amount of 0.1 part by weight or more based on 100 parts by weight of said polyester resin.

12. A circuit material according to claim 10 characterized in said cation scavenger is contained in an amount of 0.1 part by weight or more based on 100 parts by weight of the total amount of said polyester resin, said flame retardant, and said flame-retardant aid.

13. A circuit material prepared by laminating two adhesive films having a resin film and an adhesive layer on said resin film to each other with a metallic wiring inserted between the adhesive layers of said two adhesive films, characterized in that said adhesive layers are formed with an adhesive based on a polyester resin and containing a cation scavenger.

14. A circuit material according to claim 13 characterized in that said adhesive contains at least a flame retardant and a flame-retardant aid.

15. A circuit material according to claim 13 characterized in that said cation scavenger is contained in an amount of 0.1 part by weight or more based on 100 parts by weight of said polyester resin.

16. A circuit material according to claim 14 characterized in said cation scavenger is contained in an amount of 0.1 part by weight or more based on 100 parts by weight of the total amount of said polyester resin, said flame retardant, and said flame-retardant aid.

* * * * *